United States Patent
Yamaguchi et al.

(10) Patent No.: US 8,791,566 B2
(45) Date of Patent: Jul. 29, 2014

(54) ALUMINUM NITRIDE SUBSTRATE, ALUMINUM NITRIDE CIRCUIT BOARD, SEMICONDUCTOR APPARATUS, AND METHOD FOR MANUFACTURING ALUMINUM NITRIDE SUBSTRATE

(75) Inventors: Haruhiko Yamaguchi, Yokohama (JP); Yoshiyuki Fukuda, Ayase (JP)

(73) Assignees: Kabushiki Kaisha Toshiba, Tokyo (JP); Toshiba Materials Co., Ltd., Yokohama-shi (JP)

( * ) Notice: Subject to any disclaimer, the term of this patent is extended or adjusted under 35 U.S.C. 154(b) by 55 days.

(21) Appl. No.: 13/259,222

(22) PCT Filed: Feb. 5, 2010

(86) PCT No.: PCT/JP2010/051682
§ 371 (c)(1),
(2), (4) Date: Sep. 23, 2011

(87) PCT Pub. No.: WO2010/109960
PCT Pub. Date: Sep. 30, 2010

(65) Prior Publication Data
US 2012/0038038 A1    Feb. 16, 2012

(30) Foreign Application Priority Data
Mar. 26, 2009   (JP) .................... 2009-076340

(51) Int. Cl.
*H01L 23/48*     (2006.01)
*H01L 23/52*     (2006.01)
*H01L 29/40*     (2006.01)
*C04B 35/581*    (2006.01)
*H01L 23/15*     (2006.01)
*C04B 37/02*     (2006.01)
*H05K 1/03*      (2006.01)

(52) U.S. Cl.
CPC ........... *C04B 35/581* (2013.01); *C04B 2235/85* (2013.01); *C04B 2237/126* (2013.01); *C04B 2235/6581* (2013.01); *H01L 2924/13055* (2013.01); *H05K 1/0306* (2013.01); *C04B 2235/3229* (2013.01); *C04B 2235/3222* (2013.01); *C04B 2235/80* (2013.01); *C04B 2237/125* (2013.01); *C04B 2235/786* (2013.01); *C04B 2235/77* (2013.01); *C04B 2235/5436* (2013.01); *C04B 2235/3224* (2013.01); *C04B 2235/963* (2013.01); *C04B 2235/96* (2013.01); *C04B 2237/408* (2013.01); *C04B 2235/3227* (2013.01); *C04B 2235/6567* (2013.01); *C04B 2235/6562* (2013.01); *H01L 23/15* (2013.01); *C04B 37/026* (2013.01); *C04B 2237/366* (2013.01); *C04B 2235/5445* (2013.01); *C04B 2235/764* (2013.01); *C04B 2235/661* (2013.01); *C04B 2235/3225* (2013.01); *C04B 2237/706* (2013.01); *C04B 2235/9607* (2013.01); *C04B 2237/127* (2013.01)
USPC ........... 257/734; 257/103; 438/698; 438/210; 501/98.4; 501/98.5

(58) Field of Classification Search
CPC .................... H01L 2224/45124; H01L 23/15; H01L 23/49822; H01L 23/50; C04B 35/50; C04B 35/64; H05K 1/05
USPC .......... 257/734, 103; 438/698, 210; 501/98.4, 501/98.5
See application file for complete search history.

(56) References Cited

U.S. PATENT DOCUMENTS

| | | | | |
|---|---|---|---|---|
| 4,618,592 | A * | 10/1986 | Kuramoto et al. | 501/96.3 |
| 4,672,046 | A * | 6/1987 | Sawamura et al. | 501/98.5 |
| 4,803,183 | A * | 2/1989 | Schwetz et al. | 501/98.4 |
| 4,908,173 | A * | 3/1990 | Schwetz et al. | 264/29.6 |
| 5,500,395 | A * | 3/1996 | Ueno et al. | 501/98.4 |
| 5,993,699 | A * | 11/1999 | Katsuda et al. | 252/521.5 |
| 5,998,000 | A * | 12/1999 | Ikeda et al. | 428/210 |
| 5,998,320 | A * | 12/1999 | Yamada et al. | 501/98.4 |
| 6,001,760 | A * | 12/1999 | Katsuda et al. | 501/98.4 |
| 6,174,583 | B1 * | 1/2001 | Yamada et al. | 428/67 |
| 6,225,249 | B1 * | 5/2001 | Fujita et al. | 501/98.4 |
| 6,294,275 | B1 * | 9/2001 | Natsuhara et al. | 428/698 |

| | | | | |
|---|---|---|---|---|
| 2002/0102441 | A1* | 8/2002 | Shinosawa et al. | 428/698 |
| 2005/0014628 | A1* | 1/2005 | Yoshikawa et al. | 501/95.2 |
| 2005/0019242 | A1* | 1/2005 | Serole et al. | 423/325 |
| 2006/0163605 | A1* | 7/2006 | Miyahara | 257/103 |
| 2006/0183625 | A1* | 8/2006 | Miyahara | 501/98.4 |
| 2009/0075071 | A1* | 3/2009 | Komatsu et al. | 428/338 |
| 2009/0088312 | A1* | 4/2009 | Umekawa et al. | 501/98.6 |
| 2010/0243635 | A1* | 9/2010 | Nakamura et al. | 219/270 |

FOREIGN PATENT DOCUMENTS

| | | |
|---|---|---|
| JP | 06 040772 | 2/1994 |
| JP | 10 025160 | 1/1998 |
| WO | 2006 135016 | 12/2006 |

OTHER PUBLICATIONS

English translation of the International Preliminary Report on Patentability issued Oct. 18, 2011, in PCT/JP2010/051682.

English translation of the Written Opinion of the International Searching Authority issued Mar. 16, 2010, in PCT/JP2010/051682.

International Search Report issued Mar. 16, 2010 in PCT/JP10/051682 filed Feb. 5, 2010.

* cited by examiner

*Primary Examiner* — Fernando L Toledo

*Assistant Examiner* — Mohammed Shamsuzzaman

(74) *Attorney, Agent, or Firm* — Oblon, Spivak, McClelland, Maier & Neustadt, L.L.P.

(57) ABSTRACT

The present invention provides an aluminum nitride substrate and an aluminum nitride circuit board having excellent insulation characteristics and heat dissipation properties and having high strength, a semiconductor apparatus, and a method for manufacturing an aluminum nitride substrate.

An aluminum nitride substrate according to the present invention is an aluminum nitride substrate having aluminum nitride as a main component and comprising a polycrystal containing a plurality of aluminum nitride grains, and complex oxide grains being present at grain boundaries of the aluminum nitride grains and including a rare earth element and aluminum, wherein the aluminum nitride grains have a maximum grain size of 10 μm or less, the complex oxide grains have a maximum grain size smaller than the maximum grain size of the aluminum nitride grains, the number of the complex oxide grains having a grain size of 1 μm or more being present in a field of view of 100 μm×100 μm of a surface of the aluminum nitride substrate observed is 40 or more, the aluminum nitride substrate has a bending strength of 400 MPa or more in an unpolished state after firing, and the aluminum nitride substrate has a volume resistivity of $10^{12}$ Ωm or more.

7 Claims, 1 Drawing Sheet

ALUMINUM NITRIDE SUBSTRATE, ALUMINUM NITRIDE CIRCUIT BOARD, SEMICONDUCTOR APPARATUS, AND METHOD FOR MANUFACTURING ALUMINUM NITRIDE SUBSTRATE

TECHNICAL FIELD

The present invention relates to an aluminum nitride substrate, an aluminum nitride circuit board, and a method for manufacturing an aluminum nitride substrate, and particularly to an aluminum nitride substrate and an aluminum nitride circuit board having excellent insulation characteristics and heat dissipation properties and used for a power transistor or the like, and a method for manufacturing an aluminum nitride substrate. In addition, the present invention relates to a semiconductor apparatus using these.

BACKGROUND ART

A ceramic substrate having aluminum nitride as a main component has excellent insulation characteristics and heat dissipation properties. A metal conductor layer is bonded to this ceramic substrate having aluminum nitride as a main component by an active metal method, a direct bonding method, or the like to form a circuit board. This circuit board is used as a circuit board for a high power semiconductor, such as a power transistor. For power transistors, a plurality of power transistor chips (hereinafter also referred to as chips) are incorporated in one package to form a power transistor module (hereinafter also referred to as a module).

The power transistor is used at high power, and therefore, an amount of heat generation of the chip is large. In recent years, due to miniaturization of the module, a size of the chip has also become small, and an amount of heat generation per unit area has tended to become larger.

When the chips generate heat in this manner, the entire module thermally expands. At this time, since an end portion of the module is fixed to a heat dissipating fin or the like, bending moment occurs in the entire module in use of the power transistors. Therefore, there is a problem that if the ceramic substrate used for insulation of the chips from each other has weak strength, a crack occurs in the substrate and insulation failure occurs in the module.

In addition, in these days, a lead-free solder is often used for soldering the chip and the like to the ceramic substrate for consideration of environment. Generally, the lead-free solder has a higher melting point than a lead-containing solder. Therefore, when the lead-free solder is used, soldering temperature increases regardless of whether in a reflow method or a flow method.

Further, it is also necessary for a solder used for bonding between a base metal of the module and the ceramic substrate to be lead-free. This base metal-ceramic substrate soldering provides a largest soldering area in the module. Therefore, when reflow temperature increases, bending moment applied to the module also becomes very large due to a difference in coefficient of linear expansion between the base metal and the ceramic substrate. Therefore, when the ceramic substrate has weak strength, there is a possibility that a crack occurs in the substrate also during assembly of the module.

In this manner, in addition to insulation properties and heat dissipation properties, high strength is also required of a ceramic substrate used for a power module.

Regarding this, Japanese Patent Laid-Open No. 2007-63122 (Patent Document 1) discloses an aluminum nitride substrate having a high thermal conductivity and excellent heat dissipation properties. In addition, Japanese Patent Laid-Open No. 2003-201179 (Patent Document 2) discloses an aluminum nitride substrate having high heat dissipation characteristics and mechanical strength.

CITATION LIST

Patent Document

Patent Document 1: Japanese Patent Laid-Open No. 2007-63122
Patent Document 2: Japanese Patent Laid-Open No. 2003-201179

SUMMARY OF INVENTION

Problems to be Solved by the Invention

However, the aluminum nitride substrates disclosed in Patent Document 1 and Patent Document 2 do not have sufficient strength. For example, the aluminum nitride substrate disclosed in Patent Document 1 has a thermal conductivity of more than 200 W/m·K, but has low strength. And the aluminum nitride substrate disclosed in Patent Document 2 has excellent strength, but adjustment of an amount of a Si component is necessary. A problem of the Si component is that when the Si component segregates in the aluminum nitride substrate, the Si component reacts with carbon in the substrate to form SiC having high electrical conductivity, thus a volume resistance value is decreased locally, that is, electrical conductivity is increased. When the substrate does not have sufficient insulation properties, unnecessary conduction occurs between circuits to cause malfunction of a semiconductor device.

The present invention has been made in view of the above circumstances. The present invention has an object to provide an aluminum nitride substrate and an aluminum nitride circuit board having excellent insulation characteristics and heat dissipation properties and having high strength, a semiconductor apparatus, and a method for manufacturing an aluminum nitride substrate.

Means for Solving the Problems

The present invention has been completed by finding that a bending strength of an aluminum nitride substrate can be improved by controlling a grain size of aluminum nitride grains in the aluminum nitride substrate, and controlling a grain size and content of complex oxide grains derived from a sintering aid, and the like.

An aluminum nitride substrate according to the present invention solves the above problems and is an aluminum nitride substrate having aluminum nitride as a main component and comprising a polycrystal containing a plurality of aluminum nitride grains, and complex oxide grains being present at grain boundaries of the aluminum nitride grains and including a rare earth element and aluminum, wherein the aluminum nitride grains have a maximum grain size of 10 µm or less, the complex oxide grains have a maximum grain size smaller than the maximum grain size of the aluminum nitride grains, the number of the complex oxide grains having a grain size of 1 µm or more being present in a field of view of 100 µm×100 µm of a surface of the aluminum nitride substrate observed is 40 or more, the aluminum nitride substrate has a bending strength of 400 MPa or more in an unpolished state after firing, and the aluminum nitride substrate has a volume resistivity of $10^{12}$ Ωm or more.

In addition, an aluminum nitride circuit board according to the present invention solves the above problems and comprises the above aluminum nitride substrate and a conductor portion provided on a surface of the aluminum nitride substrate.

Further, a semiconductor apparatus according to the present invention solves the above problems and comprises the above aluminum nitride circuit board and a semiconductor device mounted on the conductor portion of the aluminum nitride circuit board.

In addition, a method for manufacturing an aluminum nitride substrate according to the present invention solves the above problems and comprises a degreasing step of degreasing a first aluminum nitride molded body, obtained by molding an aluminum nitride powder, a rare earth oxide powder, and an organic binder, in air to obtain a second aluminum nitride molded body; a first sintering step of sintering the second aluminum nitride molded body in a vacuum at 1300° C. to 1500° C. to obtain a first sintered body; and a second sintering step of sintering the first sintered body in an inert atmosphere at 1750° C. to 1820° C. to obtain an aluminum nitride substrate.

Advantages of the Invention

The aluminum nitride substrate and the method for manufacturing the same according to the present invention provide an aluminum nitride substrate having excellent insulation characteristics and heat dissipation properties and having high strength. Particularly, excellent strength is obtained even without polishing, and therefore, manufacturing cost can be reduced.

The aluminum nitride circuit board according to the present invention provides an aluminum nitride circuit board having excellent insulation characteristics and heat dissipation properties and having high strength. In addition, it is possible to provide a semiconductor apparatus having high reliability.

DESCRIPTION OF EMBODIMENTS

[Aluminum Nitride Substrate]

Figure 1:
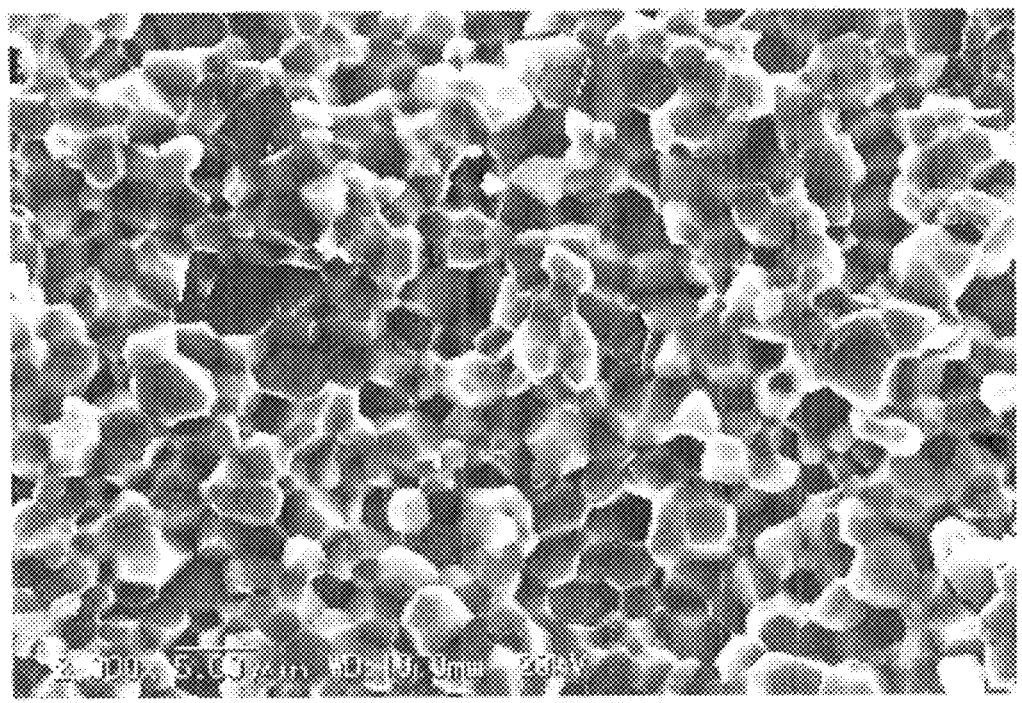
FIG. 1 shows a result of SEM observation of a fracture surface of an aluminum nitride substrate obtained in Example 1.

An aluminum nitride substrate according to the present invention is a composite material having aluminum nitride as a main component. The aluminum nitride substrate comprises a polycrystal containing a plurality of aluminum nitride grains, and complex oxide grains including a rare earth element and aluminum. In the aluminum nitride substrate according to the present invention, the complex oxide grains are present at grain boundaries of the aluminum nitride grains.

The aluminum nitride grains have a maximum grain size of 10 µm or less, preferably 3 µm to 9 µm, and further preferably 3 µm to 6 µm.

Here, the maximum grain size of the aluminum nitride grains is the maximum grain size of the aluminum nitride grains in the aluminum nitride substrate and means, for example, the maximum grain size of the aluminum nitride grains observed on a fracture surface of the aluminum nitride substrate. The maximum grain size of the aluminum nitride grains is specifically obtained by taking an enlarged photograph of a fracture surface of the aluminum nitride substrate by an SEM (scanning electron microscope), forming a 50 µm×50 µm rectangular measurement region on the fracture surface, measuring a size of the aluminum nitride grains being present in this measurement region, and the like. The aluminum nitride grains are generally spherical, and therefore, as a method of measuring a size of the aluminum nitride grains, a line intercept method is used as a simple method. In the line intercept method, the size of the aluminum nitride grains is obtained from a formula of (50 µm/a number of the aluminum nitride grains) by counting the number of the aluminum nitride grains on a 50 µm straight line. If this operation is performed three times or more, an average grain size can be provided.

If the aluminum nitride grains have a maximum grain size of more than 10 µm, there is a possibility that the aluminum nitride grains become a starting point of a break and a bending strength of the substrate decreases. In addition, if the size of the aluminum nitride grains become larger, a triple point increases, which also causes a decrease in bending strength.

If the aluminum nitride grains have a maximum grain size of less than 3 µm, an abundance ratio of grain boundary phases increases, and therefore, a thermal conductivity may be less than 160 W/m·K.

The aluminum nitride grains preferably have an average grain size of 2 µm to 6 µm.

Here, the average grain size of the aluminum nitride grains is the average grain size of the aluminum nitride grains in the aluminum nitride substrate and means, for example, the average grain size of the aluminum nitride grains observed on a fracture surface of the aluminum nitride substrate. A specific measurement method for the average grain size of the aluminum nitride grains is similar to the measurement method for the maximum grain size of the aluminum nitride grains.

If the aluminum nitride grains have an average grain size of less than 3 µm, the abundance ratio of grain boundary phases increases, and therefore, the thermal conductivity may be less than 160 W/m·K.

If the aluminum nitride grains have an average grain size of more than 6 µm, there is a possibility that the aluminum nitride grains become a starting point of a break and a bending strength of the substrate decreases.

The complex oxide grains are grains of a complex oxide including a rare earth element and aluminum.

Examples of the rare earth element for producing the complex oxide include at least one element selected from Y and lanthanoids, such as La, Ce, Pr, Nd, Sm, Gd, Dy, Ho, Er, and Yb. Among the rare earth elements, Y is preferred because Y reacts with aluminum to form YAG (yttrium•aluminum•garnet) and YAG has high bonding force to the aluminum nitride grains.

The complex oxide grains are any of grains of YAM (monoclinic structure: $M_4N_2O_9$), grains of YAG (yttrium•aluminum•garnet structure: $M_3N_5O_{12}$), and grains of YAP (perovskite structure: $M_1N_1O_3$) and are not particularly limited.

Here, the complex oxide grains of the aluminum nitride substrate being YAM, YAG, or YAP grains is determined, for example, by a crystal structure of an aluminum nitride substrate surface detected by an X-ray surface analysis method.

The complex oxide grains present in the aluminum nitride substrate are composed of at least one of YAM grains, YAG grains, and YAP grains, and may be a single phase of any one, two phases, or three phases of YAM, YAG, and YAP.

The complex oxide grains have a maximum grain size smaller than the maximum grain size of the aluminum nitride grains.

Here, the maximum grain size of the complex oxide grains is the maximum grain size of the complex oxide grains in the aluminum nitride substrate and means, for example, the maximum grain size of the complex oxide grains observed on a fracture surface of the aluminum nitride substrate. A specific measurement method for the maximum grain size of the complex oxide grains is similar to the measurement method for the maximum grain size of the aluminum nitride grains.

If the maximum grain size of the complex oxide grains is equal to or more than the maximum grain size of the aluminum nitride grains, there is a possibility that the complex oxide grains become a starting point of a break and the bending strength of the substrate decreases.

If the maximum grain size of the complex oxide grains is equal to or more than the maximum grain size of the aluminum nitride grains, a bonding strength of an aluminum nitride circuit board tends to decrease when the aluminum nitride substrate and a metal plate are bonded to each other, using an active metal brazing material, to fabricate the aluminum nitride circuit board. This is because the reaction between the active metal and the aluminum nitride to form an active metal nitride is prevented by an existence of the large-size grain of the complex oxide grains. The complex oxide grains preferably have a maximum grain size of 7 μm or less. In addition, the complex oxide grains preferably have a grain size of 2 to 3 μm on average.

A detailed reason why the bonding strength of the aluminum nitride circuit board tends to decrease will be described below. When the aluminum nitride substrate and a metal plate, such as a copper plate, are bonded to each other, using an active metal brazing material, an interface between the aluminum nitride substrate and the active metal brazing material is adhered mainly with an active metal nitride produced by the reaction between N of the aluminum nitride grains on an aluminum nitride substrate surface and Ti, Hf, Zr, or the like in the active metal brazing material. Therefore, if the complex oxide grains having a large grain size, which do not contribute to the reaction with the Ti, Hf, Zr, or the like in the active metal brazing material, are present on the aluminum nitride substrate surface, the N of the aluminum nitride grains is not densely present on the aluminum nitride substrate surface, and a density of the active metal nitride produced decreases. Therefore, bonding strength between the aluminum nitride substrate surface and an active metal brazing material layer tends to decrease. Further, when a thin film of an active metal, such as Ti, Hf, and Zr, is used instead of the active metal brazing material, the bonding strength may decrease for a similar reason.

The number of the complex oxide grains having a grain size of 1 μm or more being present in a field of view of 100 μm×100 μm of a surface of the aluminum nitride substrate observed is 40 or more, preferably 40 to 70, and more preferably 45 to 70.

Examples of a method for observing a surface of the aluminum nitride substrate include a method for observing a surface of the aluminum nitride substrate by an SEM.

If the number of the complex oxide grains having a grain size of 1 μm or more present in the field of view of the surface of the aluminum nitride substrate observed is less than 40, the complex oxide grains do not sufficiently adhere the aluminum nitride grains to each other, and the bending strength of the aluminum nitride substrate may decrease. In addition, a partial decrease in volume resistivity is also caused.

If the number of the complex oxide grains having a grain size of 1 μm or more present in the field of view of the surface of the aluminum nitride substrate observed is more than 70, the thermal conductivity of the aluminum nitride substrate tends to decrease.

In addition, if the number of the complex oxide grains having a grain size of 1 μm or more is more than 70, a bonding strength of an aluminum nitride circuit board tends to decrease when the aluminum nitride substrate and a metal plate are bonded to each other, using an active metal brazing material, to fabricate the aluminum nitride circuit board.

A reason why the bonding strength of the aluminum nitride circuit board tends to decrease is as follows. If a lot of the complex oxide grains, which do not contribute to reaction with Ti, Hf, Zr, or the like in the active metal brazing material, are present on an aluminum nitride substrate surface, N of the aluminum nitride grains is not densely present, and a density of an active metal nitride produced decreases. Therefore, bonding strength between the aluminum nitride substrate surface and an active metal brazing material layer tends to decrease.

In the aluminum nitride substrate according to the present invention, a content of the rare earth element with respect to the aluminum nitride substrate is usually 3% by mass to 6% by mass in terms of a rare earth oxide equivalent amount.

Here, the rare earth oxide equivalent amount refers to a mass of an oxide of the rare earth element equivalent to the rare earth element in the aluminum nitride substrate. For example, when the rare earth element in the aluminum nitride substrate is Y, the oxide of the rare earth element is $Y_2O_3$.

If the content of the rare earth element with respect to the aluminum nitride substrate is less than 3% by mass in terms of the rare earth oxide equivalent amount, an amount of a liquid phase component required in sintering decreases. Thus, it becomes difficult to densify the aluminum nitride grains and the complex oxide grains of the aluminum nitride substrate, and the thermal conductivity of the aluminum nitride substrate may decrease.

If the content of the rare earth element with respect to the aluminum nitride substrate is more than 6% by mass in terms of the rare earth oxide equivalent amount, densification of the grains is promoted, and a grain size of the complex oxide after sintering becomes too large, and the bending strength of the aluminum nitride substrate may decrease.

The aluminum nitride substrate according to the present invention may have Si as an impurity. A content of Si in the aluminum nitride substrate is equivalent to 50 ppm or less of a simple substance of Si by mass.

The aluminum nitride substrate according to the present invention is usually obtained through sintering steps, such as a first sintering step and a second sintering step.

The aluminum nitride substrate according to the present invention usually has a surface roughness Ra of 3 μm to 5 μm in an unpolished state after firing in the second sintering step, a last sintering step.

The aluminum nitride substrate according to the present invention has a bending strength of 400 MPa or more, preferably 400 MPa to 500 MPa, in the unpolished state after firing in the second sintering step. Here, the bending strength means three-point bending strength.

When the aluminum nitride substrate according to the present invention is polished to a surface roughness Ra of 1 μm or less in a polishing step after firing in the second sintering step, the bending strength can be 450 MPa or more, preferably 450 MPa to 550 MPa, and more preferably 500 MPa to 550 MPa.

The aluminum nitride substrate according to the present invention has a volume resistivity of $10^{12}$ Ωm or more as measured by a four-terminal method in the unpolished state after firing. An upper limit of the volume resistivity is not particularly limited, but is preferably $10^{15}$ Ωm or less. The volume resistivity is measured by the four-terminal method according to JIS-C-2141.

The aluminum nitride substrate according to the present invention usually has a thermal conductivity of 160 W/m·K or more, preferably 160 W/m·K to 190 W/m·K, in the unpolished state after firing.

Here, the thermal conductivity means a thermal conductivity measured by a laser flash method.

In the aluminum nitride substrate according to the present invention, the complex oxide grains exposed on the surface are small in size and amount. Therefore, a production reaction of the active metal nitride between the N of the aluminum nitride grains on the aluminum nitride substrate surface and the active metal brazing material occurs in a wide region, and bonding strength between the aluminum nitride substrate and the active metal brazing material is high. Therefore, the aluminum nitride substrate according to the present invention can be firmly bonded to the metal plate via the active metal brazing material layer, even in the unpolished state after sintering, and the aluminum nitride circuit board can be fabricated without a surface polishing step. Therefore, the aluminum nitride substrate according to the present invention is preferred as a raw material for manufacturing an aluminum nitride circuit board according to the present invention.

The aluminum nitride substrate according to the present invention is efficiently manufactured, for example, by a method for manufacturing an aluminum nitride substrate according to the present invention below.

[Method for Manufacturing Aluminum Nitride Substrate]

The method for manufacturing an aluminum nitride substrate according to the present invention comprises a degreasing step, a first sintering step, and a second sintering step.

(Degreasing Step)

The degreasing step is a step of degreasing a first aluminum nitride molded body, obtained by molding an aluminum nitride powder, a rare earth oxide powder, and an organic binder, in air to obtain a second aluminum nitride molded body.

Specifically, the degreasing step has a first aluminum nitride molded body fabricating step of molding an aluminum nitride powder, a rare earth oxide powder, and an organic binder to obtain a first aluminum nitride molded body, and a second aluminum nitride molded body fabricating step of degreasing the first aluminum nitride molded body in air to obtain a second aluminum nitride molded body.

<First Aluminum Nitride Molded Body Fabricating Step>

In the degreasing step, first, the first aluminum nitride molded body fabricating step is performed.

The first aluminum nitride molded body fabricating step is a step of molding an aluminum nitride powder, a rare earth oxide powder, and an organic binder to obtain a first aluminum nitride molded body.

As the aluminum nitride powder, for example, the aluminum nitride powder usually having an average grain size $D_{50}$ of 0.5 μm to 2 μm, preferably 0.8 μm to 1.5 μm, can be used. Here, $D_{50}$ means a 50% accumulative grain size. When the aluminum nitride powder undergoes the first and second sintering steps, aluminum nitride grains are produced.

As the rare earth oxide powder, for example, a powder of an oxide of at least one rare earth element selected from Y and lanthanoids, such as La, Ce, Pr, Nd, Sm, Gd, Dy, Ho, Er, and Yb is used. Specific examples of the rare earth oxide powder include a $Y_2O_3$ powder.

When the rare earth oxide powder undergoes the first and second sintering steps, the rare earth oxide powder reacts with the aluminum nitride powder to produce a complex oxide including a rare earth element and aluminum. Grains of the complex oxide are present at grain boundaries of the aluminum nitride grains, and strongly adhere adjacent aluminum nitride grains to each other.

Among the rare earth element oxide powders, a $Y_2O_3$ powder is preferred because the $Y_2O_3$ powder reacts with aluminum to form yttrium aluminum oxide, such as YAG, and the yttrium aluminum oxide has high bonding force to the aluminum nitride grains.

As the rare earth element oxide powder, for example, the rare earth element oxide powder usually having an average grain size $D_{50}$ of 0.8 μm to 2 μm, preferably 1.0 μm to 1.5 μm, can be used.

Examples of the organic binder include PVB (polyvinyl butyral). The organic binder bonds the aluminum nitride powder and the rare earth element oxide powder together to fabricate the first aluminum nitride molded body.

When the above aluminum nitride powder, rare earth element oxide powder, and organic binder are mixed in an organic solvent, for example, ethanol, toluene, or ketone, a slurry is made. When the organic solvent is removed from this slurry, a molded body in which the aluminum nitride powder and the rare earth element oxide powder are adhered by the organic binder is obtained. For example, when the molded body is molded using a doctor blade method for the slurry, and the organic solvent is removed from the molded body, a sheet-shaped molded body (green sheet) is obtained.

When the doctor blade method is used, a thickness of the green sheet can be decreased, and sufficient degreasing in the green sheet is easily performed. Therefore, an amount of remaining carbon in an obtained aluminum nitride substrate can be reduced.

With this sheet-shaped molded body as it is, or by cutting this sheet-shaped molded body to a desired size, as required, the first aluminum nitride molded body is obtained.

The first aluminum nitride molded body may be in a form other than the sheet shape. When the first aluminum nitride molded body is sheet-shaped, a molding method should be a method that can mold a sheet-shaped aluminum nitride molded body, and is not limited to the doctor blade method.

The first aluminum nitride molded body usually comprises 3% by mass to 6% by mass of the rare earth oxide powder with respect to a total amount of the aluminum nitride powder and the rare earth oxide powder. When the first aluminum nitride molded body comprises the rare earth oxide powder in this content range, a bending strength of the obtained aluminum nitride substrate increases.

<Second Aluminum Nitride Molded Body Fabricating Step>

In the degreasing step, the second aluminum nitride molded body fabricating step is performed following the first aluminum nitride molded body fabricating step.

The second aluminum nitride molded body fabricating step is a step of degreasing the first aluminum nitride molded body in air to obtain a second aluminum nitride molded body.

The second aluminum nitride molded body is obtained by removing the organic binder from the first aluminum nitride molded body by degreasing. The second aluminum nitride molded body is a molded body comprising substantially no carbon and comprising the aluminum nitride powder and the rare earth oxide powder.

The first aluminum nitride molded body is degreased by heat treatment in the air. By performing heat treatment in the air, the organic binder is efficiently eliminated. Therefore, in the obtained aluminum nitride substrate, the amount of remaining carbon decreases, and characteristics, such as bending strength and volume resistivity, are enhanced.

Heat treatment conditions for degreasing is usually 400° C. to 600° C. When the heat treatment conditions for degreasing is 400° C. to 600° C., the organic binder is efficiently eliminated. If the organic binder remains more than necessary, an amount of carbon in the molded body increases, which is unpreferred.

(First Sintering Step)

The first sintering step is a step of sintering the second aluminum nitride molded body in a vacuum at 1300° C. to 1500° C. to obtain a first sintered body.

Sintering the second aluminum nitride molded body provides the first sintered body that is a polycrystal containing aluminum nitride grains and complex oxide grains. In the first sintered body, the complex oxide grains are present at grain boundaries of the aluminum nitride grains, and include a rare earth element and aluminum.

However, though the first sintered body is a polycrystal, usually, voids are present between the aluminum nitride grains, between the aluminum nitride grains and the complex oxide grains, and the like. Therefore, the first sintered body is a polycrystal that is not densified as much as a second sintered body.

In the first sintering step, the vacuum means a state in which an atmosphere, such as the air, is usually at $10^{-3}$ Pa or less, preferably $10^{-4}$ Pa or less.

By sintering the second aluminum nitride molded body in a vacuum, a carbon-containing component, such as the organic binder, is removed in sintering, and the amount of remaining carbon in the aluminum nitride grains and the complex oxide grains can be reduced.

A treatment temperature of the first sintering step is 1300° C. to 1500° C.

If the treatment temperature of the first sintering step is less than 1300° C., sintering of the aluminum nitride grains and the complex oxide grains is insufficient, and the bending strength of the aluminum nitride substrate tends to decrease.

If the treatment temperature of the first sintering step is more than 1500° C., grain growth of the aluminum nitride grains and the complex oxide grains are promoted too much, and the bending strength of the aluminum nitride substrate tends to decrease.

A treatment time of the first sintering step is usually 2 hours to 5 hours.

If the treatment time is less than 2 hours, the sintering of the aluminum nitride grains and the complex oxide grains is insufficient, and the bending strength of the aluminum nitride substrate tends to decrease.

If the treatment time is more than 5 hours, the grain growth of the aluminum nitride grains and the complex oxide grains are promoted too much, and the bending strength of the aluminum nitride substrate tends to decrease.

(Second Sintering Step)

The second sintering step is a step of sintering the first sintered body in an inert atmosphere at 1750° C. to 1820° C. to obtain an aluminum nitride substrate.

By sintering the first sintered body, the aluminum nitride grains and the complex oxide grains grow and are densified, and the aluminum nitride substrate is obtained.

As the inert atmosphere, for example, a nitrogen gas or an argon gas is used. Among these, a nitrogen gas is inexpensive and therefore is preferred.

The inert atmosphere is usually at 1 atm to 100 atm. When a pressure of the inert atmosphere is more than 1 atm, a crystal structure of the aluminum nitride substrate is dense.

By performing the second sintering step in the inert atmosphere, a proper amount of deoxidation is performed in the aluminum nitride substrate, and the aluminum nitride grains and the complex oxide grains grow and are densified.

A treatment temperature of the second sintering step is 1750° C. to 1820° C.

If the treatment temperature of the second sintering step is less than 1750° C., densification of the aluminum nitride grains and the complex oxide grains is insufficient, and the bending strength of the aluminum nitride substrate tends to decrease.

If the treatment temperature of the second sintering step is more than 1820° C., the grain growth of the aluminum nitride grains and the complex oxide grains are promoted too much, and the bending strength of the aluminum nitride substrate tends to decrease.

A treatment time of the second sintering step is usually 2 hours to 5 hours.

If the treatment time is less than 2 hours, the densification of the aluminum nitride grains and the complex oxide grains is insufficient, and the bending strength of the aluminum nitride substrate tends to decrease.

If the treatment time is more than 5 hours, the grain growth of the aluminum nitride grains and the complex oxide grains are promoted too much, and the bending strength of the aluminum nitride substrate tends to decrease.

In transition from the first sintering step to the second sintering step, it is possible to perform the second sintering step after once performing a cooling step of cooling the first sintered body to room temperature after completion of the first sintering step, or it is possible to perform the second sintering step after performing a temperature increasing step of increasing temperature by continuously heating the first sintered body without cooling, after the completion of the first sintering step. When the second sintering step is continuously performed after the first sintering step, the temperature increasing step is preferably performed with a temperature increasing rate from a sintering temperature of the first sintering step to a sintering temperature of the second sintering step being 80° C./h or less, further 30 to 80° C./h. If the temperature increasing rate is more than 80° C./h, the temperature increasing rate is too fast, and the complex oxide grains grow easily. On the other hand, if the temperature increasing rate is less than 30° C./h, there is no problem of grain growth, but manufacturing time is too long, which is unpreferred in terms of manufacturing.

The aluminum nitride substrate obtained through the second sintering step is the aluminum nitride substrate according to the present invention.

In other words, the obtained aluminum nitride substrate is an aluminum nitride substrate comprising a polycrystal containing a plurality of aluminum nitride grains, and complex oxide grains located in a space of grain boundaries of the aluminum nitride grains and including a rare earth element and aluminum. In the aluminum nitride substrate, the complex oxide grains have a maximum grain size smaller than a maximum grain size of the aluminum nitride grains, and the number of the complex oxide grains having a grain size of 1 µm or more being present in a field of view of 100 µm×100 µm of a surface of the aluminum nitride substrate observed is 40 or more.

Thus, a high density aluminum nitride sintered body having a relative density of 99% or more is obtained. The relative density is a value obtained by (measured density value/theoretical density)×100(%). The measured density value may be obtained by an Archimedes method, and the theoretical density may be obtained by a simple method using a value of an oxide equivalent to a sintering aid component. For example, in a case of an aluminum nitride sintered body comprising Y equivalent to 4% by mass of $Y_2O_3$ and a remainder, aluminum nitride, the theoretical density is (0.96×3.3 g/cm³+0.04×5.03 g/cm³)=3.37 g/cm³. The theoretical density of aluminum nitride (AlN), 3.3 g/cm³, and the theoretical density of yttrium oxide ($Y_2O_3$), 5.03 g/cm³, are cited from "Iwanami Rikagaku Jiten (Iwanami Dictionary of Physics and Chemistry), Fifth Edition."

In addition, a thickness of the aluminum nitride substrate is not particularly limited, but is preferably 0.2 to 1 mm when used for a circuit board.

The method for manufacturing an aluminum nitride substrate according to the present invention may further comprise a polishing step, as required.

(Polishing Step)

The polishing step is a step of polishing an aluminum nitride substrate surface to a surface roughness Ra of 1 μm or less after the second sintering step.

The aluminum nitride substrate according to the present invention usually has a surface roughness Ra of 3 μm to 5 μm in an unpolished state after firing.

When the surface of the aluminum nitride substrate is polished to a surface roughness Ra of 1 μm or less in this step, a three-point bending strength of the aluminum nitride substrate increases.

Examples of a polishing method for polishing the surface of the aluminum nitride substrate to a surface roughness Ra of 1 μm or less include buffing and lapping.

[Aluminum Nitride Circuit Board]

The aluminum nitride circuit board according to the present invention comprises the aluminum nitride substrate according to the present invention described above and a conductor portion provided on a surface of the aluminum nitride substrate.

Examples of the conductor portion include metal conductors, such as copper, and active metal thin films the metal of which is one or more selected from Ti, Zr, and Hf.

When the conductor portion is a metal conductor, such as copper, the aluminum nitride circuit board can be fabricated, for example, by bonding a metal plate to a surface of the aluminum nitride substrate via an active metal brazing material layer, and appropriately performing etching and the like on the metal plate to form a conductor circuit.

The active metal brazing material layer is a layer of an active metal brazing material. The active metal brazing material is a brazing material containing at least one of Ti, Hf, and Zr, and is a brazing material that can directly braze ceramic and metal without metallization treatment or surface treatment. The active metal brazing material is adhered to the aluminum nitride substrate by reacting Ti, Hf, Zr, or the like in the brazing material with N of the aluminum nitride grains on the aluminum nitride substrate surface each other to produce an active metal nitride.

Examples of the active metal brazing material include Ag—Cu—Ti—In and Ag—Cu—Ti. For specific composition, examples thereof include a brazing material comprising 15 to 30% by mass of Cu and 0.5 to 5% by mass of an active metal of at least one of Ti, Hf, and Zr, with a remainder being Ag, and a brazing material comprising 15 to 30% by mass of Cu, 0.5 to 5% by mass of an active metal of at least one of Ti, Hf, and Zr, and 5 to 20% by mass of at least one of In, Sn, and Zn, with a remainder being Ag.

Examples of the metal plate include a copper plate.

In the aluminum nitride substrate according to the present invention, the complex oxide grains exposed on the surface are small in size and amount. Therefore, a large amount of the active metal nitride is produced at an interface between the aluminum nitride substrate and the active metal brazing material, and bonding strength between the aluminum nitride substrate and the active metal brazing material is high. Therefore, the aluminum nitride substrate according to the present invention can be firmly bonded to the metal plate via the active metal brazing material layer, even in the unpolished state after sintering, and the aluminum nitride circuit board can be fabricated without the surface polishing step. Therefore, the aluminum nitride circuit board according to the present invention can significantly decrease manufacturing cost compared with conventional ones.

When the conductor portion is an active metal thin film of one or more selected from Ti, Zr, and Hf, examples of a thin film conductor portion comprising the active metal thin film include those having a three-layer structure, such as Ti/Pt/Au.

[Semiconductor Apparatus]

A semiconductor apparatus according to the present invention comprises the aluminum nitride circuit board according to the present invention described above and a semiconductor device mounted on the conductor portion of the aluminum nitride circuit board.

Examples of a method for mounting the semiconductor device on the conductor portion include a method for mounting the semiconductor device on the metal plate or the thin film via a solder layer. Examples of this semiconductor device include a power device, such as an IGBT, and a light-emitting diode (LED). In addition, wiring connection can be made by wire bonding, as required.

EXAMPLES

Examples will be shown below, but the present invention is not construed as being limited to these Examples.

Example 1

Fabrication of Aluminum Nitride Substrate

<Degreasing Step>

An AlN powder having an average grain size of 1.0 μm and a $Y_2O_3$ powder having an average grain size of 1.2 μm were introduced into ethanol in a proportion shown in Table 1 and mixed, and PVB (polyvinyl butyral) was further added to prepare a slurry. An amount of the AlN powder shown in Table 1 is a remainder obtained by subtracting an amount of the $Y_2O_3$ powder from 100% by mass of a total amount of the AlN powder and the $Y_2O_3$ powder. Next, a green sheet was molded from this slurry by a doctor blade method. The obtained green sheet was cut to fabricate a 50 mm×45 mm×1 mm thick sheet-shaped first molded body.

The first molded body was heated in air at 450° C. for 4 hours for degreasing to obtain a second molded body.

<First Sintering Step>

The second molded body was heated in a vacuum at $10^{-4}$ Pa or less at 1400° C. for 4 hours to obtain a first sintered body.

<Second Sintering Step>

The first sintered body was heated in a nitrogen gas atmosphere at 1 atm at 1750° C. for 4 hours to obtain an aluminum nitride substrate. The obtained substrate had a thickness of 0.8 mm.

(Evaluation of Aluminum Nitride Substrate)
<Surface Roughness Ra>

A surface roughness Ra of a fired surface of the obtained aluminum nitride substrate was measured. The surface roughness Ra varied depending on a measurement position and was in a range of 3 μm to 5 μm.

<Maximum Diameter and Average Grain Size of AlN Grains and Maximum Diameter of Complex Oxide Grains>

For the obtained aluminum nitride substrate, a maximum diameter and average grain size of AlN grains within the aluminum nitride substrate were obtained. An enlarged photograph of a fracture surface obtained by fracturing the aluminum nitride substrate by man power was taken at a magnification of 2000 by an SEM (scanning electron microscope), and a 50 μm×50 μm rectangular measurement region on the fracture surface was formed in this photograph. A grain size of AlN grains and a grain size of complex oxide grains present in this measurement region were measured, and a maximum value and average value of the AlN grains, and a maximum diameter of the complex oxide grains were calculated.

<The Number of Complex Oxide Grains Having Grain Size of 1 μm or More>

For the obtained aluminum nitride substrate, the number of the complex oxide grains having a grain size of 1 μm or more on a surface of the aluminum nitride substrate was obtained. An enlarged photograph of a surface of the aluminum nitride substrate was taken at a magnification of 1000 by the SEM, and a 100 μm×100 μm rectangular measurement region on the substrate surface was formed in this photograph. The number of the complex oxide grains having a grain size of 1 μm or more present in this measurement region was obtained.

In the enlarged photographs of the fracture surface and surface of the aluminum nitride substrate, the AlN grains are gray, and the complex oxide grains are white, and therefore, the AlN grains and the complex oxide grains in the enlarged photographs can be distinguished by a naked eye.

Figure 2:
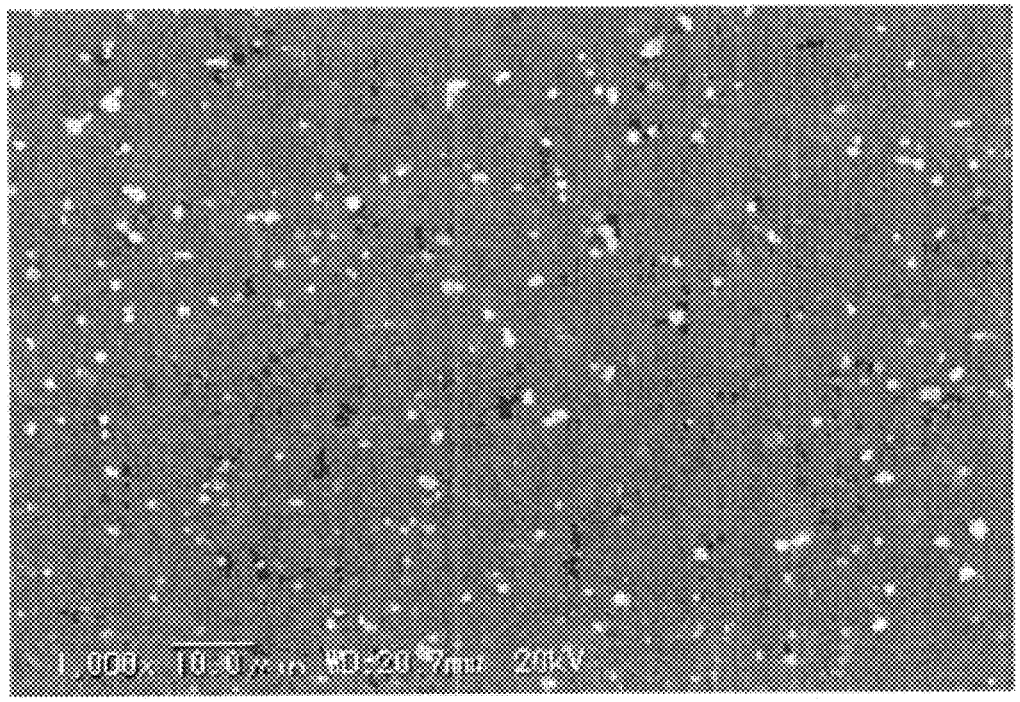
FIG. 2 shows a result of SEM observation of a surface of the aluminum nitride substrate obtained in Example 1.

A result of SEM observation of the fracture surface of the aluminum nitride substrate is shown in FIG. 1, and a result of SEM observation of the surface of the aluminum nitride substrate is shown in FIG. 2. In FIG. 1 and FIG. 2, white portions are the complex oxide grains, and black portions are the AlN grains.

<Relative Density>

A relative density of the aluminum nitride substrate was obtained by (measured density value/theoretical density)×100(%). The measured density value was obtained by an Archimedes method, and the theoretical density was obtained by a simple method using a value of an oxide equivalent to a sintering aid component. The relative density was 99.7%.

<Bending Strength>

A three-point bending strength of the obtained aluminum nitride substrate was measured according to JIS-R-1601 under conditions of a span of 30 mm and a crosshead speed of 0.5 mm/min, and this value was determined as bending strength.

The bending strength was also measured for the aluminum nitride substrate having a surface roughness Ra of 1 μm obtained by buffing, in addition to the unpolished aluminum nitride substrate as fired.

<Volume Resistivity>

A volume resistivity of the unpolished aluminum nitride substrate as fired was measured by a four-terminal method according to JIS-C-2141. The volume resistivity was in a range of $10^{13}$ to $10^{14}$ Ωm. Further, the complex oxide grains having a grain size of 1 μm or more had an average grain size in a range of 2 to 3 μm.

Manufacturing conditions and measurement results of the aluminum nitride substrate are shown in Table 1 to Table 3.

TABLE 1

| | AlN Powder (Remainder) | $Y_2O_3$ Powder | | | Degreasing Step | | |
|---|---|---|---|---|---|---|---|
| | Average Grain Size (μm) | Average Grain Size (μm) | Additive Amount ($Y_2O_3$ Reduced Quantity: mass %) | Organic Binder | Atmosphere | Temperature (° C.) | Time (Hr) |
| Example 1 | 1.0 | 1.2 | 3 | PVB | air | 450 | 4 |
| Example 2 | 1.0 | 1.2 | 4 | PVB | air | 450 | 4 |
| Example 3 | 1.0 | 1.2 | 4 | PVB | air | 450 | 4 |
| Example 4 | 1.0 | 1.2 | 5 | PVB | air | 450 | 4 |
| Example 5 | 1.0 | 1.2 | 6 | PVB | air | 450 | 4 |
| Comparative Example 1 | 1.0 | 1.2 | 5 | PVB | air | 450 | 4 |
| Comparative Example 2 | 1.0 | 1.2 | 5 | PVB | air | 450 | 4 |

TABLE 2

| | First Sintering Step | | | Second Sintering Step | | |
|---|---|---|---|---|---|---|
| | Atmosphere | Temperature (° C.) | Time (Hr) | Atmosphere | Temperature (° C.) | Time (Hr) |
| Example 1 | vacuum | 1400 | 4 | nitrogen | 1750 | 4 |
| Example 2 | vacuum | 1500 | 4 | nitrogen | 1780 | 4 |
| Example 3 | vacuum | 1400 | 4 | nitrogen | 1780 | 4 |
| Example 4 | vacuum | 1400 | 4 | nitrogen | 1800 | 4 |
| Example 5 | vacuum | 1400 | 4 | nitrogen | 1800 | 4 |
| Comparative Example 1 | vacuum | 1500 | 2 | nitrogen | 1850 | 3 |
| Comparative Example 2 | vacuum | 1600 | 4 | nitrogen | 1750 | 4 |

TABLE 3

| | Volume Resistivity ($\Omega$m) | Thermal Conductivity (W/mK) | AlN Grain Size ($\mu$m) Maximum | AlN Grain Size ($\mu$m) Average | The Number of Complex Oxide Grains Having Grain Size of 1 mm or More (number of pieces) | Bending Strength (Mpa) Unpolished Aluminum Nitride Substrate as Fired | Bending Strength (Mpa) Aluminum Nitride Substrate having Surface Roughness Ra of 1 mm by Surface Polishing |
|---|---|---|---|---|---|---|---|
| Example 1 | $10^{13}$ or more | 182 | 7 | 3 | 60 | 474 | 515 |
| Example 2 | $10^{13}$ or more | 175 | 7 | 3 | 53 | 433 | 470 |
| Example 3 | $10^{13}$ or more | 173 | 8 | 3 | 45 | 403 | 453 |
| Example 4 | $10^{13}$ or more | 170 | 8 | 4 | 55 | 487 | 526 |
| Example 5 | $10^{13}$ or more | 165 | 9 | 4 | 50 | 440 | 489 |
| Comparative Example 1 | $10^{13}$ or more | 205 | 20 | 6 | 30 | 320 | 380 |
| Comparative Example 2 | — | — | not densified | — | — | — | — |

(Fabrication of Aluminum Nitride Circuit Board)

The unpolished aluminum nitride substrate as fired was used. Both surfaces of this substrate were coated with an active metal brazing material (60% by mass of Ag-24% by mass of Cu-2% by mass of Ti-14% by mass of In), and a copper plate having a thickness of 0.3 mm was bonded to the coated surfaces to fabricate an aluminum nitride circuit board.

(Evaluation of Aluminum Nitride Circuit Board)

<Bonding Strength>

For the obtained aluminum nitride circuit board, bonding strength between the aluminum nitride substrate and the copper plate was measured. The bonding strength was a value measured by peeling the copper plate from the aluminum nitride substrate, using a tensile tester.

A bonding strength of the aluminum nitride circuit board is shown in Table 4.

TABLE 4

| | Bonding Strength (kN/m) |
|---|---|
| Example 1 | 22 |
| Example 2 | 23 |
| Example 3 | 22 |
| Example 4 | 24 |
| Example 5 | 21 |
| Comparative Example 1 | 18 |
| Comparative Example 2 | — |
| Example 4 (Polished Substrate) | 24 |

Examples 2 to 5 and Comparative Examples 1 to 2

Aluminum nitride substrates and aluminum nitride circuit boards were fabricated in the same manner as Example 1, except that manufacturing conditions were changed as shown in Table 1 and Table 2. The aluminum nitride substrates according to Examples 2 to 5 had a relative density of 99.3 to 99.8%.

In Comparative Example 2, AlN grains were not densified, and an aluminum nitride substrate having sufficient strength could not be fabricated.

The obtained aluminum nitride substrates and aluminum nitride circuit boards were evaluated in the same manner as Example 1.

A surface roughness Ra of fired surfaces of the obtained aluminum nitride substrates varied depending on a measurement position and was in a range of 3 $\mu$m to 5 $\mu$m. In addition, a volume resistivity was in a range of $10^{13}$ to $10^{14}$ $\Omega$m. Further, complex oxide grains having a grain size of 1 $\mu$m or more had an average grain size in a range of 2 to 3 $\mu$m.

Manufacturing conditions and measurement results of the aluminum nitride substrates are shown in Table 1 to Table 3. A bonding strength of the aluminum nitride circuit boards is shown in Table 4.

In Example 4, the aluminum nitride circuit board was also fabricated for a case where the aluminum nitride substrate having a surface roughness Ra of 1 $\mu$m obtained by surface polishing was used instead of the unpolished aluminum nitride substrate as fired, in addition to a case where the unpolished aluminum nitride substrate as fired was used.

The obtained aluminum nitride circuit board was evaluated in the same manner as the case where the unpolished aluminum nitride substrate was used.

A bonding strength of the aluminum nitride circuit board is shown in Table 4. A data of the case where the polished aluminum nitride substrate was used, in Example 4, is indicated as "Example 4 (polished substrate)" in Table 4.

From comparison between normal Example 4 in which the unpolished aluminum nitride substrate was used and Example 4 (polished substrate) in which the polished aluminum nitride substrate was used, in Table 4, it was found that there was no large difference in the bonding strength of the aluminum nitride circuit board between a case where the aluminum nitride substrate in Example 4 was bonded to a copper plate without polishing and a case where the aluminum nitride substrate in Example 4 was bonded to a copper plate after polishing. In other words, it was found that the aluminum nitride substrate according to the present Example can be sufficiently applied to a circuit board even without polishing.

Examples 6 to 8

Aluminum nitride substrates and aluminum nitride circuit boards were fabricated in the same manner as Example 1, except that manufacturing conditions were changed as shown in Table 5.

The obtained aluminum nitride substrates and aluminum nitride circuit boards were evaluated in the same manner as Example 1. The aluminum nitride substrates according to Examples 6 to 8 had a relative density of 99.2 to 99.6%.

A surface roughness Ra of fired surfaces of the obtained aluminum nitride substrates varied depending on a measurement position and was in a range of 3 μm to 5 μm. In addition, a volume resistivity was in a range of $10^{13}$ to $10^{14}$ Ωm. Further, complex oxide grains having a grain size of 1 μm or more had an average grain size in a range of 2 to 3 μm.

Manufacturing conditions and measurement results of the aluminum nitride substrates are shown in Table 1, Table 5, and Table 6. A bonding strength of the aluminum nitride circuit boards is shown in Table 7.

TABLE 5

|  | First Sintering Step | | | Second Sintering Step | | |
|---|---|---|---|---|---|---|
|  | Atmosphere | Temperature (° C.) | Time (Hr) | Atmosphere | Temperature (° C.) | Time (Hr) |
| Example 6 | vacuum | 1300 | 5 | nitrogen | 1750 | 5 |
| Example 7 | vacuum | 1350 | 3 | nitrogen | 1780 | 4 |
| Example 8 | vacuum | 1400 | 4 | nitrogen | 1820 | 4 |

TABLE 6

|  | Volume Resistivity (Ωm) | Thermal Conductivity (W/mK) | AlN Grain Size (μm) | | The Number of Complex Oxide Grains Having Grain Size of 1 mm or More (number of pieces) | Bending Strength (Mpa) | |
|---|---|---|---|---|---|---|---|
|  |  |  | Maximum | Average |  | Unpolished Aluminum Nitride Substrate as Fired | Aluminum Nitride Substrate having Surface Roughness Ra of 1 mm by Surface Polishing |
| Example 6 | $10^{13}$ or more | 187 | 8.0 | 4.0 | 65 | 482 | 520 |
| Example 7 | $10^{13}$ or more | 170 | 5.0 | 2.7 | 56 | 468 | 485 |
| Example 8 | $10^{13}$ or more | 177 | 8.0 | 5.0 | 68 | 485 | 523 |

TABLE 7

|  | Bonding Strength (kN/m) |
|---|---|
| Example 6 | 22 |
| Example 7 | 24 |
| Example 8 | 22 |

It was found that the AlN substrates according to the present Examples (Examples 1 to 8) had a bending strength of 400 MPa or more in an unpolished state after firing, and a volume resistivity of $10^{12}$ Ωm or more.

Examples 9 to 11

Degreasing Step

97% by mass of an AlN powder having an average grain size of 0.7 μm and 3% by mass of a $Y_2O_3$ powder having an average grain size of 1.2 μm were introduced into ethanol and mixed, and PVB (polyvinyl butyral) was further added to prepare a slurry. Next, a green sheet was molded from this slurry by a doctor blade method. The obtained green sheet was cut to fabricate a 50 mm×40 mm×0.8 mm thick sheet-shaped first molded body. The first molded body was heated in air at 500° C. for 5 hours for degreasing to obtain a second molded body.

Next, the first sintering step was performed and the second sintering step was continuously performed after the first sintering step under conditions shown in Table 8 to obtain an aluminum nitride substrate.

TABLE 8

|  | First Sintering Step | | | Temperature Increasing Rate from First Sintering Step to Second Sintering Step (° C./h) | Second Sintering Step | | |
|---|---|---|---|---|---|---|---|
|  | Atmosphere | Temperature (° C.) | Time (Hr) |  | Atmosphere | Temperature (° C.) | Time (Hr) |
| Example 9 | vacuum | 1380 | 4 | 80 | nitrogen | 1750 | 4 |
| Example 10 | vacuum | 1420 | 4 | 50 | nitrogen | 1700 | 5 |
| Example 11 | vacuum | 1500 | 3 | 30 | nitrogen | 1730 | 5 |

The obtained substrates had a thickness of 0.6 mm. The same measurements as in Example 1 were performed for the obtained aluminum nitride substrates. Results of the measurements are shown in Table 9.

Bending strength was also measured for the aluminum nitride substrates having a surface roughness Ra of 1 μm or 0.5 μm obtained by buffing, in addition to the unpolished aluminum nitride substrates as fired.

TABLE 9

| | Volume Resistivity (Ωm) | Thermal Conductivity (W/mK) | AlN Grain Size (μm) | | The Number of Complex Oxide Grains Having Grain Size of 1 mm or More (number of pieces) | Bending Strength (Mpa) | | |
|---|---|---|---|---|---|---|---|---|
| | | | Maximum | Average | | Unpolished Aluminum Nitride Substrate as Fired | Aluminum Nitride Substrate having Surface Roughness Ra of 1 mm by Surface Polishing | Aluminum Nitride Substrate having Surface Roughness Ra of 0.5 mm by Surface Polishing |
| Example 9 | $10^{13}$ or more | 170 | 6 | 3 | 56 | 432 | 480 | 482 |
| Example 10 | $10^{13}$ or more | 177 | 6 | 3 | 61 | 468 | 521 | 525 |
| Example 11 | $10^{13}$ or more | 186 | 8 | 3 | 66 | 475 | 534 | 535 |

As is seen from the Tables, those obtained under control at a predetermined temperature increasing rate when continuously performing the first sintering step and the second sintering step had excellent bending strength even in a fired state. In addition, a volume resistivity was in a range of $10^{13}$ to $10^{14}$ Ωm. Further, complex oxide grains having a grain size of 1 μm or more had an average grain size in a range of 2 to 3 μm.

(Fabrication of Aluminum Nitride Circuit Boards)

Next, the aluminum nitride substrate and a copper plate were bonded to each other to fabricate an aluminum nitride circuit board, in the same manner as Example 1, except that a brazing material of 67% by mass of Ag-20% by mass of Cu-10% by mass of In-3% by mass of Ti was used as an active metal brazing material. A bonding strength of the obtained aluminum nitride circuit boards was obtained by the same method as in Example 1. Results are shown in Table 10.

TABLE 10

| | Bonding Strength (kN/m) |
|---|---|
| Example 9 | 23 |
| Example 10 | 23 |
| Example 11 | 24 |

The aluminum nitride circuit boards according to the Examples had excellent bonding strength.

As described above, it was found that the AlN circuit boards according to the present Examples also had good bonding strength. Particularly, an aluminum nitride substrate having a thermal conductivity of 160 to 190 W/m·K can provide a circuit board having excellent bonding strength even without polishing. High bonding strength can also improve a reliability of a semiconductor apparatus in which a semiconductor device is mounted.

The invention claimed is:

1. An aluminum nitride substrate suitable for a circuit board, comprising:
a polycrystal, wherein the polycrystal further comprises:
a plurality of aluminum nitride grains; and
a plurality of complex oxide grains including a rare earth element and aluminum at grain boundaries of the aluminum nitride grains,
wherein
the plurality of aluminum nitride grains have a maximum aluminum nitride grain size of 10 μm or less,
the plurality of complex oxide grains have a maximum oxide grain size smaller than the maximum aluminum nitride grain size,
a number of complex oxide grains in the plurality of complex oxide grains of grain size of 1 μm or more in an area of 100 μm×100 μm of a surface of the aluminum nitride substrate observed is 40 to 70,
an average grain size of the complex oxide grains is from 2 to 3 μm,
a content of the rare earth element with respect to the aluminum nitride substrate is from 3% by mass to 6% by mass in terms of a rare earth oxide equivalent amount,
the aluminum nitride substrate has a relative density of 99% or more,
the aluminum nitride substrate has a bending strength of 400 MPa to 500 MPa in an unpolished state after firing,
the aluminum nitride substrate has a volume resistivity of $10^{12}$ Ωm to $10^{15}$ Ωm, and
the aluminum nitride substrate has a thermal conductivity of 160 W/m·K to 190 W/m·K;
wherein the aluminum nitride substrate has the bending strength of 450 MPa to 550 MPa when the aluminum nitride substrate is polished to a surface roughness Ra of up to 1 μm after firing.

2. The aluminum nitride substrate suitable for a circuit board according to claim 1, wherein an average grain size among the plurality of aluminum nitride grains is from 3 μm to 9 μm.

3. An aluminum nitride circuit board comprising:
the aluminum nitride substrate according to claim 1 and
a conductor portion provided on a surface of the aluminum nitride substrate.

4. The aluminum nitride circuit board according to claim 3, wherein the conductor portion is a metal plate bonded to the aluminum nitride substrate via an active metal brazing material layer.

5. A semiconductor apparatus comprising:
the aluminum nitride circuit board according to claim 3 and
a semiconductor device mounted on the conductor portion of the aluminum nitride circuit board.

6. The aluminum nitride substrate suitable for a circuit board according to claim 1, wherein the complex oxide grains have a maximum grain size of 7 μm or less.

7. The aluminum nitride substrate suitable for a circuit board according to claim 1, wherein the aluminum nitride substrate has a volume resistivity of $10^{13}$ Ωm to $10^{15}$ Ωm.

* * * * *